United States Patent
Nomura et al.

(10) Patent No.: US 8,643,007 B2
(45) Date of Patent: Feb. 4, 2014

(54) SEMICONDUCTOR DEVICE

(75) Inventors: Masumi Nomura, Isehara (JP); Kosei Noda, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 164 days.

(21) Appl. No.: 13/397,838

(22) Filed: Feb. 16, 2012

(65) Prior Publication Data
US 2012/0211744 A1      Aug. 23, 2012

(30) Foreign Application Priority Data

Feb. 23, 2011   (JP) ................................. 2011-037352

(51) Int. Cl.
*H01L 29/786*   (2006.01)
(52) U.S. Cl.
USPC .......................................................... 257/43
(58) Field of Classification Search
USPC ............................................ 257/43, E29.273
See application file for complete search history.

(56) References Cited

U.S. PATENT DOCUMENTS

| | | | |
|---|---|---|---|
| 5,485,027 A | 1/1996 | Williams et al. | |
| 5,528,032 A | 6/1996 | Uchiyama | |
| 5,714,869 A | 2/1998 | Tamechika et al. | |
| 5,731,856 A | 3/1998 | Kim et al. | |
| 5,744,864 A | 4/1998 | Cillessen et al. | |
| 5,751,381 A * | 5/1998 | Ono et al. ........................ | 399/46 |
| 6,239,470 B1 * | 5/2001 | Yamazaki ...................... | 257/350 |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,800,875 B1 * | 10/2004 | Yamazaki ....................... | 257/72 |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Hayashi et al., "42.1: Invited Paper: Improved Amorphous In—Ga—Zn—O TFTs," SID Digest '08: SID International Symposium Digest of Technical Papers, May 20, 2008, vol. 39, pp. 621-624.

(Continued)

*Primary Examiner* — Thao P. Le
(74) *Attorney, Agent, or Firm* — Eric J. Robinson; Robinson Intellectual Property Law Office, P.C.

(57) ABSTRACT

It is an object to reduce concentration of an electric field on an end of a drain electrode of a semiconductor device. A semiconductor device includes an oxide semiconductor film including a first region and a second region; a pair of electrodes which is partly in contact with the oxide semiconductor film; a gate insulating film over the oxide semiconductor film; and a gate electrode that overlaps with part of one of the pair of electrodes and the first region with the gate insulating film provided therebetween. At least part of the first region and part of the second region are between the pair of electrodes. The gate electrode does not overlap with the other of the pair of electrodes.

33 Claims, 9 Drawing Sheets

(56) References Cited

U.S. PATENT DOCUMENTS

| | | |
|---|---|---|
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0001184 A1 | 1/2008 | Genrikh et al. |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2009/0001384 A1 | 1/2009 | Kosaki et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0231021 A1 | 9/2009 | Koyama et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0085081 A1 | 4/2010 | Ofuji et al. |
| 2010/0092800 A1 | 4/2010 | Itagaki et al. |
| 2010/0109002 A1 | 5/2010 | Itagaki et al. |
| 2010/0230754 A1 | 9/2010 | Isobe et al. |
| 2011/0073864 A1* | 3/2011 | Liu et al. .................. 257/59 |
| 2011/0181349 A1 | 7/2011 | Yamazaki et al. |
| 2011/0204362 A1 | 8/2011 | Akimoto et al. |
| 2011/0284837 A1 | 11/2011 | Nishijima |
| 2012/0001173 A1* | 1/2012 | Suzuki et al. .................. 257/43 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 | 9/1994 |
| JP | 07-211917 | 8/1995 |
| JP | 08-264794 A | 10/1996 |
| JP | 09-121470 | 5/1997 |
| JP | 11-505377 | 5/1999 |
| JP | 2000-044236 A | 2/2000 |
| JP | 2000-150900 A | 5/2000 |
| JP | 2001-068561 | 3/2001 |
| JP | 2001-251772 | 9/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 | 4/2007 |
| JP | 2007-123861 | 5/2007 |
| JP | 2008-225338 | 9/2008 |
| JP | 2009-004733 | 1/2009 |
| JP | 2009-010142 | 1/2009 |
| WO | WO-2004/114391 | 12/2004 |
| WO | WO 2008/143304 | 11/2008 |

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

(56) References Cited

OTHER PUBLICATIONS

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn-Oxide TFT,", SID Digest '09 SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transistion:The "Blue Phase", ", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTS,", Proceedings of the 16th International Display Workshops, 2009, pp. 689-692.

Park.J et al., "Amorphous Indium—Gallium—Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn-Oxide TFT,", AM-FPD '09 Digest of Technical Papers, Jul. 1, 2009, pp. 41-44.

Osada.T et al., "Development of Driver-Integrated Panel Using Amorphous In—Ga—Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT,", SID Digest '9 : SID International Symposium Digest of Technical Papers, May 31, 2009, pp. 1110-1112.

Ohara.H et al., "21.3:4.0 In. QVGA AMOLED Display Using In—Ga—Zn-Oxide TFTS With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symosium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

(56) References Cited

OTHER PUBLICATIONS

Lee.H et al., "Current Status of, Challenges to, and Perspective View of AM-OLED ,", IDW '06 : Proceedings fo the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "SPINEL,YBFE2O4, and YB2FE3O7 Tpes of Structures for Compounds in the IN2O3 and SC2O3—A2O3—BO Systems [A; Fe, Ga, or Al; B: Mg, Mn, Fe, Ni, Cu,or Zn] at Temperatures Over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 208, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

* cited by examiner

SEMICONDUCTOR DEVICE

BACKGROUND OF THE INVENTION

1. Field of the Invention

The present invention relates to a semiconductor device. Note that in this specification, a semiconductor device refers to a device including a semiconductor element. As such a semiconductor element, a transistor is given, for example. Further, the semiconductor device includes a liquid crystal display device and the like.

2. Description of the Related Art

In contrast to transistors manufactured using silicon, attention has been drawn to a technique by which a transistor is manufactured using an oxide semiconductor, which is a wide-gap semiconductor, for its channel and is applied to an electronic device or an optical device. For example, a technique of manufacturing a transistor by using zinc oxide or In—Ga—Zn—O-based oxide as an oxide semiconductor, and using the transistor for a switching element of a pixel of a display device and the like is disclosed in Patent Document 1 and Patent Document 2.

REFERENCE

[Patent Document 1] Japanese Published Patent Application No. 2007-123861
[Patent Document 2] Japanese Published Patent Application No. 2007-096055

SUMMARY OF THE INVENTION

First, an example of a semiconductor device is illustrated in FIG. 6.

The semiconductor device illustrated in FIG. 6 includes a base insulating film 101 which is provided over a substrate 100; an oxide semiconductor film 504 which is provided over the base insulating film 101; a source electrode 502a and a drain electrode 502b which are partly in contact with the oxide semiconductor film 504 and are provided over the oxide semiconductor film 504 so as to be separated from each other; a gate insulating film 506 provided so as to cover the oxide semiconductor film 504, the source electrode 502a, and the drain electrode 502b; a gate electrode 508 which is provided over the gate insulating film 506 so as to overlap with part of the source electrode 502a and part of the drain electrode 502b with the gate insulating film 506 provided therebetween; an interlayer insulating film 510 provided so as to cover the gate insulating film 506 and the gate electrode 508; and a wiring 516 which is connected to the source electrode 502a or the drain electrode 502b in a contact hole 530 provided in the interlayer insulating film 510.

The semiconductor device illustrated in FIG. 6 can be applied to, for example, a switch of an electric power circuit. In the case where the semiconductor device illustrated in FIG. 6 is used as a switch of an electric power circuit, high withstand voltages of a semiconductor film and a gate insulating film with respect to a drain voltage (a potential difference between a drain potential and a source potential serving as a reference) are important. For this reason, it is effective to use a wide-gap semiconductor such as an oxide semiconductor, silicon carbide, or GaN for the semiconductor film illustrated in FIG. 6. However, even in the case of a semiconductor device including an oxide semiconductor which is a wide-gap semiconductor, since part of the gate electrode and part of the drain electrode overlap with each other in the structure illustrated in FIG. 6, an electric field is concentrated on a particular part (mainly an end of the drain electrode) when a drain voltage is high. Accordingly, there is a problem in that dielectric breakdown easily occurs in a gate insulating film or an oxide semiconductor film.

An object of one embodiment of the present invention is to reduce the concentration of an electric field in a semiconductor device.

An object of one embodiment of the present invention is to reduce the concentration of an electric field in a semiconductor device and to suppress a reduction in on-state current as much as possible.

One embodiment of the present invention is a semiconductor device which includes an wide-gap semiconductor film including a first region and a second region, a pair of electrodes provided to be in contact with the wide-gap semiconductor film, a gate insulating film over the wide-gap semiconductor film, and a gate electrode that overlaps with part of one of the pair of electrodes and the first region with the gate insulating film provided therebetween. At least part of the first region and part of the second region are between the pair of electrodes. The gate electrode does not overlap with the other of the pair of electrodes.

One embodiment of the present invention is a semiconductor device which includes an wide-gap semiconductor film including a first region and a second region, a pair of electrodes provided to be in contact with the wide-gap semiconductor film, a gate insulating film over the wide-gap semiconductor film, and a gate electrode that overlaps with part of one of the pair of electrodes and the first region with the gate insulating film provided therebetween. At least part of the first region and part of the second region are between the pair of electrodes. At least part of the second region is between the gate electrode and the other of the pair of electrodes.

One embodiment of the present invention is a semiconductor device which includes a gate electrode, a gate insulating film over the gate electrode, an wide-gap semiconductor film that is provided over the gate insulating film and includes a first region and a second region, and a pair of electrodes that is provided so as to be in contact with the wide-gap semiconductor film. At least part of the first region and part of the second region are between the pair of electrodes. The gate electrode overlaps with part of one of the pair of electrodes and the first region with the gate insulating film provided therebetween. The gate electrode does not overlap with the other of the pair of electrodes.

One embodiment of the present invention is a semiconductor device which includes a gate electrode, a gate insulating film over the gate electrode, an wide-gap semiconductor film that is provided over the gate insulating film and includes a first region and a second region, and a pair of electrodes that is in contact with the wide-gap semiconductor film. At least part of the first region and part of the second region are between the pair of electrodes. The gate electrode overlaps part of one of the pair of electrodes and the first region with the gate insulating film provided therebetween. At least part of the second region is between the gate electrode and the other of the pair of electrodes.

One embodiment of the present invention is a semiconductor device in which an electric resistance of the first region is lower than an electric resistance of the second region.

One embodiment of the present invention is a semiconductor device in which the one of the pair of electrodes is a source electrode and the other is a drain electrode.

Examples of the wide-gap semiconductor are oxide semiconductors having a band gap (also referred to as a width of a forbidden band) larger than 1.1 eV which is the band gap of silicon (such as an In—Ga—Zn—O-based oxide semiconductor (about 3.15 eV), indium oxide (about 3.0 eV), indium tin oxide (about 3.0 eV), indium gallium oxide (about 3.3 eV), indium zinc oxide (about 2.7 eV), tin oxide (about 3.3 eV), and zinc oxide (about 3.37 eV)), silicon carbide (about 3.3 eV), GaN (about 3.4 eV), and the like.

One embodiment of the present invention is a semiconductor device in which an oxide semiconductor is used as a wide-gap semiconductor, and the oxide semiconductor contains two or more kinds of elements selected from In, Ga, Sn, and Zn.

One embodiment of the present invention is a semiconductor device in which the second region contains one or more of elements selected from nitrogen, phosphorus, arsenic, and a rare gas at $1 \times 10^{17}$ atoms/cm$^3$ or higher and $1 \times 10^{22}$ atoms/cm$^3$ or lower.

According to one embodiment of the present invention, when a semiconductor device is applied to a switch of an electric power circuit, concentration of an electric field can be reduced.

According to one embodiment of the present invention, when a semiconductor device is applied to a switch of an electric power circuit, concentration of an electric field can be reduced and a reduction in on-state current can be suppressed as much as possible.

DETAILED DESCRIPTION OF THE INVENTION

Figure 1A:
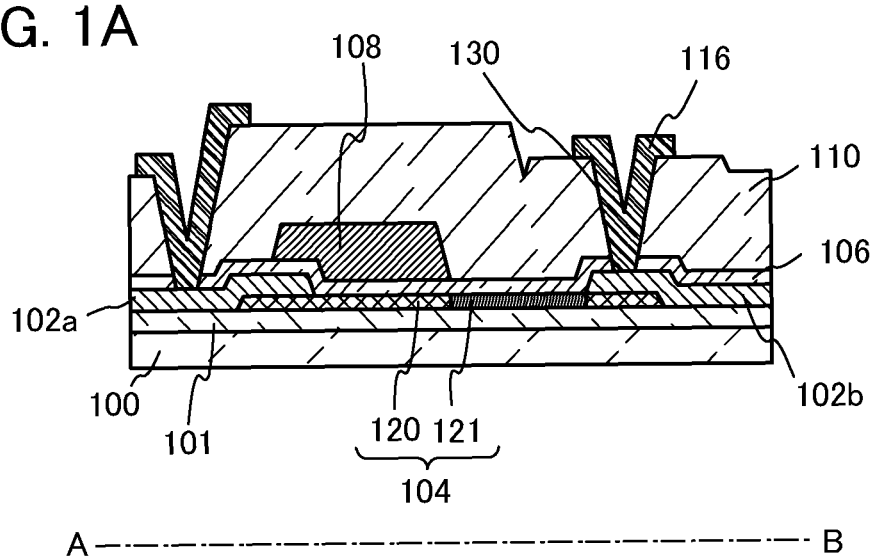
FIGS. 1A and 1B are respectively a cross-sectional view and a top view of an example of a semiconductor device of one embodiment of the present invention.

Embodiments of the present invention will be described below with reference to the accompanying drawings. However, the present invention is not limited to the following description, and those skilled in the art will appreciate that a variety of modifications can be made to the modes and details without departing from the spirit and scope of the invention. Therefore, the invention should not be construed as being limited to the description in the following embodiments. Note that the same portions or portions having the same function in the structure of the present invention described below are denoted by the same reference numerals in common among different drawings and repetitive description thereof will be omitted.

Note that in each drawing described in this specification, the size, the film thickness, or the region of each component is exaggerated for clarity in some cases. Therefore, embodiments of the present invention are not limited to such scales.

Note that terms such as "first", "second", and "third" in this specification are used in order to avoid confusion among components, and the terms do not limit the components numerically. Therefore, for example, the term "first" can be replaced with the term "second", "third", or the like as appropriate.

Embodiment 1

In this embodiment, a semiconductor device which is one embodiment of the present invention will be described.

Figure 1B:
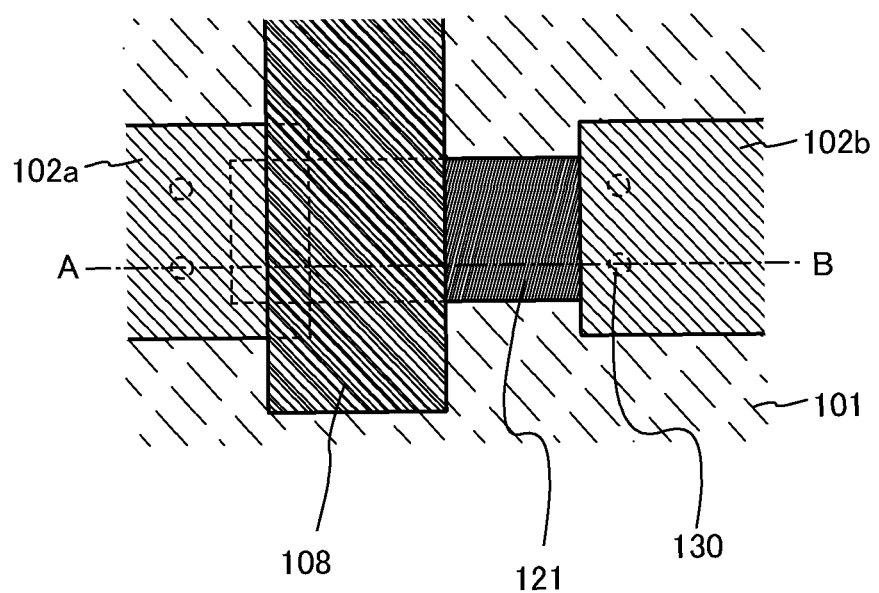

FIGS. 1A and 1B illustrate a semiconductor device which is one embodiment of the present invention. FIG. 1A is a cross-sectional view of the semiconductor device which is one embodiment of the present invention. FIG. 1B is a top view of the semiconductor device which is one embodiment of the present invention. Note that FIG. 1A is a cross-sectional view along A-B in FIG. 1B.

The semiconductor device illustrated in FIG. 1A includes the base insulating film 101 which is provided over the substrate 100; an oxide semiconductor film 104 which is provided over the base insulating film 101 and includes a first region 120 and a second region 121; a source electrode 102a and a drain electrode 102b which are partly in contact with the oxide semiconductor film 104 and are provided over the oxide semiconductor film 104 so as to be separated from each other; a gate insulating film 106 provided over the oxide semiconductor film 104, the source electrode 102a, and the drain electrode 102b; a gate electrode 108 which is provided over the gate insulating film 106, overlaps with part of the source electrode 102a and the first region 120 with the gate insulating film 106 provided therebetween, and does not overlap with the drain electrode 102b; an interlayer insulating film 110 which is provided over the gate insulating film 106 and the gate electrode 108; and a wiring 116 which is connected to the source electrode 102a or the drain electrode 102b in a contact hole 130 provided for the interlayer insulating film 110.

Note that at least part of the first region 120 and part of the second region 121 are formed between the source electrode 102a and the drain electrode 102b.

Further, the second region 121 has lower electric resistance than the first region 120, and the second region 121 has higher electric resistance than the drain electrode 102b.

The second region 121 contains one or more elements selected from nitrogen phosphorus, arsenic and rare gases, and the concentration thereof is preferably higher than or equal to $1 \times 10^{17}$ atoms/cm$^3$ and lower than or equal to $1 \times 10^{22}$ atoms/cm$^3$.

The conductivity of the second region 121 is higher than or equal to 10 S/cm and lower than or equal to 1000 S/cm, preferably higher than or equal to 100 S/cm and lower than or equal to 1000 S/cm. When the conductivity is too low, the on-state current of the transistor is decreased. By setting the conductivity not to be too high, the influence of an electric field generated in the second region 121 can be reduced, and further, a short-channel effect can be suppressed in the case of fine transistors.

The oxide semiconductor film 104 is in a single crystal state, a polycrystalline (also referred to as polycrystal) state, an amorphous state, or the like.

The oxide semiconductor film 104 is preferably a CAAC-OS (c-axis aligned crystalline oxide semiconductor) film.

The CAAC-OS film is not completely single crystal nor completely amorphous (also referred to as non-crystal). The CAAC-OS film is an oxide semiconductor film with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electric characteristics of the transistor due to irradiation with visible light or ultraviolet light can be reduced. Thus, the transistor has high reliability.

With the above structure where the oxide semiconductor film has an off-set region which does not overlap with the gate electrode and the drain electrode, when a semiconductor device which is one embodiment of the present invention is applied to a switch of an electric power circuit or the like, concentration of an electric field on an end of a drain electrode can be reduced and thus withstand voltage can be increased. Thus, the range of voltage which can be used is extended and therefore the semiconductor device can be used for various switches. Further, in the semiconductor device which is one embodiment of the present invention, concentration of an electric field can be reduced as described above and a reduction in on-state current can be suppressed as much as possible.

<Example of Method for Manufacturing Semiconductor Device>

Next, a method for manufacturing the semiconductor device illustrated in FIGS. 1A and 1B will be described with reference to FIGS. 2A to 2D.

Figure 2A:
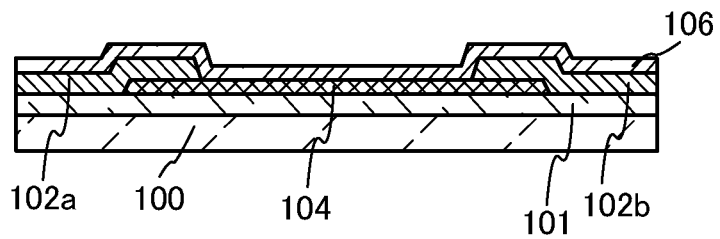
FIGS. 2A to 2D are cross-sectional views illustrating an example of a manufacturing process of a semiconductor device which is one embodiment of the present invention.

As illustrated in FIG. 2A, the base insulating film 101, the oxide semiconductor film 104, the source electrode 102a, the drain electrode 102b, and the gate insulating film 106 are formed over the substrate 100.

There is no particular limitation on the property of a material and the like of the substrate 100 as long as the material has heat resistance enough to withstand at least heat treatment to be performed later. For example, a glass substrate, a ceramic substrate, a quartz substrate, or a sapphire substrate may be used as the substrate 100. Alternatively, a single crystal semiconductor substrate or a polycrystalline semiconductor substrate made of silicon, silicon carbide, or the like; a compound semiconductor substrate made of silicon germanium, GaN, or the like; an SOI substrate; or the like may be used as the substrate 100. Still alternatively, any of these substrates provided with a semiconductor element may be used as the substrate 100.

Alternatively, a flexible substrate may be used as the substrate 100. In the case where a transistor is provided over the flexible substrate, the transistor may be formed directly on the flexible substrate, or the transistor may be formed over a different substrate and then separated from the substrate to be transferred to the flexible substrate. In order to separate the transistor from the substrate to be transferred to the flexible substrate, a separation layer is preferably provided between the different substrate and the transistor.

The base insulating film 101 may be a single layer or a stack formed using one or more of a silicon oxide film, a silicon oxynitride film, a silicon nitride oxide film, a silicon nitride film, an aluminum oxide film, a gallium oxide film, and a zirconium oxide film.

Here, silicon oxynitride refers to a substance that contains more oxygen than nitrogen and for example, silicon oxynitride includes oxygen, nitrogen, silicon, and hydrogen at concentrations ranging from greater than or equal to 50 atomic % and less than or equal to 70 atomic %, greater than or equal to 0.5 atomic % and less than or equal to 15 atomic %, greater than or equal to 25 atomic % and less than or equal to 35 atomic %, and greater than or equal to 0 atomic % and less than or equal to 10 atomic %, respectively. In addition, silicon nitride oxide refers to a substance that contains a larger amount of nitrogen than that of oxygen. For example, silicon nitride oxide contains oxygen, nitrogen, silicon, and hydrogen at concentrations ranging from greater than or equal to 5 atomic % and less than or equal to 30 atomic %, greater than or equal to 20 atomic % and less than or equal to 55 atomic %, greater than or equal to 25 atomic % and less than or equal to 35 atomic %, and greater than or equal to 10 atomic % and less than or equal to 25 atomic %, respectively. Note that rates of oxygen, nitrogen, silicon, and hydrogen fall within the aforementioned ranges in the cases where measurement is performed using Rutherford backscattering spectrometry (RBS) or hydrogen forward scattering (HFS). In addition, the total of the percentages of the constituent elements does not exceed 100 atomic %.

As the base insulating film 101, a film from which oxygen is released by heating may be used.

"Oxygen is released by heating" means that the amount of released oxygen which is converted into oxygen atoms is greater than or equal to $1.0 \times 10^{18}$ atoms/cm³, preferably greater than or equal to $3.0 \times 10^{20}$ atoms/cm³ in thermal desorption spectroscopy (TDS).

Here, a method in which the amount of released oxygen is measured by being converted into oxygen atoms using TDS analysis will be described.

The amount of released gas in TDS analysis is proportional to the integral value of a spectrum. Therefore, the amount of released gas can be calculated from the ratio between the integral value of a spectrum of an insulating film and the reference value of a standard sample. The reference value of a standard sample refers to the ratio of the density of a predetermined atom contained in a sample to the integral value of a spectrum.

For example, the number of the released oxygen molecules ($N_{O2}$) from an insulating film can be found according to a numerical expression 1 with the TDS analysis results of a silicon wafer containing hydrogen at a predetermined density which is the standard sample and the TDS analysis results of the insulating film. Here, all spectra having a mass number of 32 which are obtained by the TDS analysis are assumed to originate from an oxygen molecule. $CH_3OH$, which is given as a gas having a mass number of 32, is not taken into consideration on the assumption that it is unlikely to be present. Further, an oxygen molecule including an oxygen atom having a mass number of 17 or 18 which is an isotope of an oxygen atom is not taken into consideration either because the proportion of such a molecule in the natural world is minimal.

$$N_{O2} = N_{H2}/S_{H2} \times S_{O2} \times \alpha \quad \text{(numerical expression 1)}$$

$N_{H2}$ is the value obtained by conversion of the number of hydrogen molecules desorbed from the standard sample into densities. $S_{H2}$ is the integral value of a spectrum when the standard sample is subjected to TDS analysis. Here, the reference value of the standard sample is set to $N_{H2}/S_{H2}$. $S_{O2}$ is the integral value of a spectrum when the insulating film is subjected to TDS analysis. $\alpha$ is a coefficient affecting the intensity of the spectrum in the TDS analysis. Refer to Japanese Published Patent Application No. H6-275697 for details of the numerical expression 1. Note that the amount of released oxygen from the above insulating film is measured with a thermal desorption spectroscopy apparatus produced by ESCO Ltd., EMD-WA1000S/W using a silicon wafer containing a hydrogen atom at $1 \times 10^{16}$ atoms/cm³ as the standard sample.

Further, in the TDS analysis, oxygen is partly detected as an oxygen atom. The ratio between oxygen molecules and oxygen atoms can be calculated from the ionization rate of the oxygen molecules. Note that, since the above $\alpha$ includes the ionization rate of the oxygen molecules, the number of the released oxygen atoms can also be estimated through the evaluation of the number of the released oxygen molecules.

Note that $N_{O2}$ is the number of the released oxygen molecules. For the insulating film, the amount of released oxygen when converted into oxygen atoms is twice the number of the released oxygen molecules.

In the above structure, the insulating film from which oxygen is released by heating may be oxygen-excess silicon oxide ($SiO_X(X>2)$). In the oxygen-excess silicon oxide ($SiO_X(X>2)$), the number of oxygen atoms per unit volume is more than twice the number of silicon atoms per unit volume. The number of silicon atoms and the number of oxygen atoms per unit volume are measured by Rutherford backscattering spectrometry.

By supplying oxygen from the base insulating film to the oxide semiconductor film, an interface state between the base insulating film and the oxide semiconductor film can be reduced. As a result, electric charge or the like which may be produced due to an operation of the transistor or the like can be prevented from being trapped at the interface between the base insulating film and the oxide semiconductor film, and thereby a transistor with less deterioration in electric characteristics can be provided.

Further, in some cases, electric charge is generated due to oxygen deficiency in the oxide semiconductor film. In general, when oxygen vacancies are caused in an oxide semiconductor, part of the oxygen vacancies becomes a donor and generates an electron as a carrier. As a result, the threshold voltage of a transistor shifts in the negative direction. This tendency occurs remarkably in an oxygen deficiency caused on the back channel side. Note that a back channel in this embodiment refers to the vicinity of an interface of the oxide semiconductor film on the base insulating film side. When oxygen is sufficiently supplied from the base insulating film to the oxide semiconductor film, oxygen deficiency in the oxide semiconductor film which causes the negative shift of the threshold voltage can be reduced.

In other words, when oxygen deficiency is caused in the oxide semiconductor film, it is difficult to prevent trapping of electric charge at the interface between the base insulating film and the oxide semiconductor film. However, by providing an insulating film from which oxygen is released by heating as the base insulating film, the interface state between the oxide semiconductor film and the base insulating film and the oxygen deficiency in the oxide semiconductor film can be reduced, and the influence of the trapping of electric charge at the interface between the oxide semiconductor film and the base insulating film can be made small.

The oxide semiconductor film 104 is formed in such a manner that an oxide semiconductor film with a thickness of greater than or equal to 1 nm and less than or equal to 100 nm is formed by a sputtering method, a mask is formed over the oxide semiconductor film, and the oxide semiconductor film is selectively etched with the use of the mask.

The mask used in the etching of the oxide semiconductor film can be formed as appropriate by a photolithography process, an inkjet method, a printing method, or the like. Wet etching or dry etching can be employed as appropriate for the etching of the oxide semiconductor film.

A sputtering apparatus used for forming the oxide semiconductor film will be described in detail below.

The leakage rate of a treatment chamber in which the oxide semiconductor film is formed is preferably lower than or equal to $1 \times 10^{-10}$ Pa·m³/sec., whereby entry of an impurity into the film to be formed by a sputtering method can be decreased.

In order to decrease the leakage rate, internal leakage as well as external leakage needs to be reduced. The external leakage refers to inflow of gas from the outside of a vacuum system through a minute hole, a sealing defect, or the like. The internal leakage is due to leakage through a partition, such as a valve, in a vacuum system or due to released gas from an internal member. Measures need to be taken from both aspects of external leakage and internal leakage in order that the leakage rate be lower than or equal to $1 \times 10^{-10}$ Pa·m³/sec.

In order to decrease external leakage, an open/close portion of the deposition chamber is preferably sealed with a metal gasket. For the metal gasket, a metal material covered with iron fluoride, aluminum oxide, or chromium oxide is preferably used. The metal gasket realizes higher adhesion than an O-ring, and can reduce the external leakage. Further, by use of a metal material covered with iron fluoride, aluminum oxide, chromium oxide, or the like which is in the passive state, released gas containing hydrogen generated from the metal gasket is suppressed, so that the internal leakage can also be reduced.

As a member for forming an inner wall of the treatment chamber, aluminum, chromium, titanium, zirconium, nickel, or vanadium, in which the amount of a released gas containing hydrogen is small, is used. An alloy material containing iron, chromium, nickel, and the like covered with the above-mentioned material may be used. The alloy material containing iron, chromium, nickel, and the like is rigid, resistant to heat, and suitable for processing. Here, when surface unevenness of the member is decreased by polishing or the like to reduce the surface area, the released gas can be reduced. Alternatively, the above-mentioned member of the film formation apparatus may be covered with iron fluoride, aluminum oxide, chromium oxide, or the like which is in the passive state.

Furthermore, it is preferable to provide a refiner for a sputtering gas just in front of the treatment chamber. At this time, the length of a pipe between the gas refiner and the film formation chamber is less than or equal to 5 m, preferably less than or equal to 1 m. When the length of the pipe is less than or equal to 5 m or less than or equal to 1 m, the effect of the released gas from the pipe can be reduced accordingly.

Evacuation of the treatment chamber is preferably performed with a rough vacuum pump such as a dry pump and a high vacuum pump such as a sputter ion pump, a turbo molecular pump, or a cryopump in appropriate combination. The turbo molecular pump has an outstanding capability in evacuating a large-sized molecule, whereas it has a low capability in evacuating hydrogen or water. Hence, for example, it is effective to combine a dry pump and a turbo molecular pump with a cryopump having a high capability in evacuating water or a sputter ion pump having a high capability in evacuating hydrogen.

An adsorbate present at the inner wall of the treatment chamber does not affect the pressure in the deposition chamber because it is adsorbed on the inner wall, but the adsorbate leads to release of gas at the time of the evacuation of the deposition chamber. Therefore, although the leakage rate and the evacuation rate do not have a correlation, it is important that the adsorbate present in the film formation chamber be desorbed as much as possible and evacuation be performed in advance with use of a pump having high evacuation capability. Note that the film formation chamber may be subjected to baking for promotion of desorption of the adsorbate. By the baking, the rate of desorption of the adsorbate can be increased about tenfold. The baking should be performed at a temperature greater than or equal to 100° C. and less than or equal to 450° C. At this time, when the adsorbate is removed while an inert gas is introduced, the rate of desorption of water or the like, which is difficult to desorb only by evacuation, can be further increased.

In a sputtering method, an RF power supply device, an AC power supply device, a DC power supply device, or the like can be used as a power supply device for generating plasma as appropriate.

The oxide semiconductor film 104 includes at least one element selected from In, Ga, Sn, and Zn. Such an oxide semiconductor film can be formed using a target of a four-component metal oxide such as an In—Sn—Ga—Zn—O-based metal oxide; a three-component metal oxide such as an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, or a Sn—Al—Zn—O-based metal oxide; a two-component metal oxide such as an In—Zn—O-based metal oxide or a Sn—Zn—O-based metal oxide; a single component metal oxide such as a Zn—O-based metal oxide or a Sn—O-based metal oxide; or the like. In addition, the above materials may contain $SiO_2$.

Note that the In—Ga—Zn—O-based oxide semiconductor means an oxide semiconductor containing indium (In), gallium (Ga), and zinc (Zn), and there is no particular limitation on the composition ratio thereof.

As the oxide semiconductor film, a thin film of a material represented by the chemical formula, $InMO_3(ZnO)_m$ (m>0) can be used. Here, M represents one or more metal elements selected from Zn, Ga, Al, Mn, and Co. For example, M can be Ga, Ga and Al, Ga and Mn, Ga and Co, or the like.

In the case where an In—Ga—Zn—O-based material is used as the oxide semiconductor, an example of the target is a metal oxide target containing In, Ga, and Zn at a composition ratio of $In_2O_3:Ga_2O_3:ZnO=1:1:1$ [molar ratio]. Alternatively, a target having a composition ratio where $In_2O_3:Ga_2O_3:ZnO=1:1:2$ [molar ratio], a target having a composition ratio where $In_2O_3:Ga_2O_3:ZnO=1:1:4$ [molar ratio], or a target having a composition ratio where $In_2O_3:Ga_2O_3:ZnO=2:1:8$ [molar ratio] can be used. Further alternatively, a target having a composition ratio of $In_2O_3:ZnO=25:1$ to 1:4 [molar ratio] can be used.

In the case where an In—Zn—O-based material is used as an oxide semiconductor, a target therefor has a composition ratio of In:Zn=50:1 to 1:2 in an atomic ratio ($In_2O_3$:ZnO=25:1 to 1:4 in a molar ratio), preferably, In:Zn=20:1 to 1:1 in an atomic ratio ($In_2O_3$:ZnO=10:1 to 1:2 in a molar ratio), further preferably, In:Zn=15:1 to 1.5:1 in an atomic ratio ($In_2O_3$:ZnO=15:2 to 3:4 in a molar ratio). For example, in a target used for formation of an In—Zn—O-based oxide semiconductor which has an atomic ratio of In:Zn:O=X:Y:Z, the relation of Z>1.5X+Y is satisfied.

As a sputtering gas, a rare gas (typically argon) atmosphere, an oxygen atmosphere, or a mixed gas of a rare gas and oxygen is used as appropriate. It is preferable that a high-purity gas from which impurities such as hydrogen, water, a hydroxyl group, and hydride are removed be used as a sputtering gas.

The substrate temperature in deposition is set to higher than or equal to 150° C. and lower than or equal to 450° C., preferably higher than or equal to 200° C. and lower than or equal to 350° C. The deposition is performed while the substrate is heated to higher than or equal to 150° C. and lower than or equal to 450° C., preferably higher than or equal to 200° C. and lower than or equal to 350° C., whereby moisture (including hydrogen) or the like is prevented from entering a film. Further, a CAAC-OS film can be formed.

Further, heat treatment is preferably performed on the substrate 100 after the oxide semiconductor film is formed, so that hydrogen is released from the oxide semiconductor film and part of oxygen contained in the base insulating film 101 is diffused into the oxide semiconductor film 104 and the base insulating film 101 in the vicinity of the interface with the oxide semiconductor film 104. Through the heat treatment, a CAAC-OS film with higher crystallinity can be formed.

The temperature of the heat treatment is preferably a temperature at which hydrogen is released from the oxide semiconductor film 104 and part of oxygen contained in the base insulating film 101 is released and diffused into the oxide semiconductor film 104. The temperature is typically higher than or equal to 200° C. and lower than the strain point of the substrate 100, preferably higher than or equal to 250° C. and lower than or equal to 450° C.

A rapid thermal annealing (RTA) apparatus can be used in the heat treatment. With use of the RTA apparatus, only in a short time, the heat treatment can be performed at a temperature higher than or equal to the strain point of the substrate. Therefore, time to form an oxide semiconductor film in which the proportion of a crystalline region is higher than that of an amorphous region can be shortened.

The heat treatment can be performed in an inert gas atmosphere; typically the heat treatment is preferably performed in a rare gas (such as helium, neon, argon, xenon, or krypton) atmosphere or a nitrogen atmosphere. Alternatively, the heat treatment may be performed in an oxygen atmosphere or a reduced-pressure atmosphere. The heating time is 3 minutes to 24 hours. As the treatment time is increased, the proportion of a crystal region with respect to that of an amorphous region in the semiconductor layer can be increased. The ratio of a crystalline region to an amorphous region in the oxide semiconductor film can be increased as the treatment time is increased. Note that heat treatment for longer than 24 hours is not preferable because the productivity is decreased.

A method for forming the CAAC-OS film is not limited to the method described in this embodiment.

As described above, in the process for forming the oxide semiconductor film, entry of impurities is suppressed as much as possible through control of the pressure of the treatment chamber, leakage rate of the treatment chamber, and the like, whereby entry of impurities such as hydrogen to be contained in the base insulating film and the oxide semiconductor film can be reduced. In addition, diffusion of impurities such as hydrogen from the base insulating film to the oxide semiconductor film can be reduced. Hydrogen contained in the oxide semiconductor is reacted with oxygen bonded to a metal atom to be water, and in addition, a defect is formed in a lattice from which oxygen is detached (or a portion from which oxygen is removed).

Thus, by reducing impurities as much as possible in the process for forming the oxide semiconductor film, defects in the oxide semiconductor film can be reduced. As described above, by using a CAAC-OS film that is highly purified through removal of the impurities as much as possible for the channel region, the amount of change in threshold voltage of the transistor before and after light irradiation or the BT stress test is small, whereby the transistor can have stable electric characteristics.

Note that a metal oxide which can be used for the oxide semiconductor film has a band gap of greater than or equal to 2 eV, preferably greater than or equal to 2.5 eV, more preferably greater than or equal to 3 eV. In this manner, off-state current of a transistor can be reduced by using a metal oxide having a wide band gap.

The source electrode 102a and the drain electrode 102b are each formed to have a single-layer structure or a stacked-layer structure including, as a conductive material, any of metals such as aluminum, titanium, chromium, nickel, copper, yttrium, zirconium, molybdenum, silver, tantalum, and tungsten and an alloy containing any of these metals as a main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is formed over a copper-magnesium-aluminum alloy film, and a three-layer structure in which a titanium film, an aluminum film, and a titanium film are stacked in this order can be used. Note that a transparent conductive material containing indium oxide, tin oxide, or zinc oxide may be used. The source electrode 102a and the drain electrode 102b also function as wirings.

The gate insulating film 106 may be formed using a single layer or stacked layers of, for example, silicon oxide, silicon oxynitride, silicon nitride oxide, silicon nitride, aluminum oxide, hafnium oxide, gallium oxide, or the like. For example, the gate insulating film 106 may be formed using a thermal oxidation method, a CVD method, a sputtering method, or the like. As the gate insulating film 106, a film from which oxygen is released by heating may be used. By using a film from which oxygen is released by heating as the gate insulating film 106, oxygen deficiency caused in the oxide semiconductor can be reduced and deterioration in electric characteristics of the transistor can be suppressed.

When the gate insulating film 106 is formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, gate leakage current can be reduced. Further, a stacked structure can be used in which a high-k material and one or more of silicon oxide, silicon nitride, silicon oxynitride, silicon nitride oxide, aluminum oxide, aluminum oxynitride, and gallium oxide are stacked. The thickness of the first gate insulating film 106 is preferably 1 nm to 300 nm, further preferably 5 nm to 50 nm.

Figure 2B:
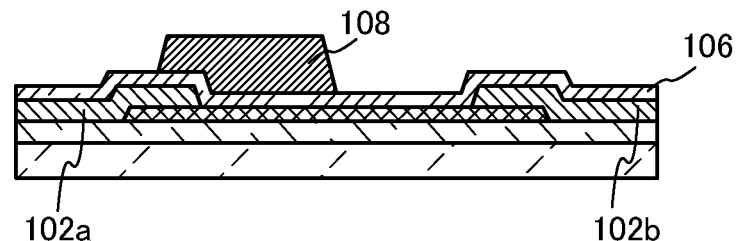

Subsequently, as shown in FIG. 2B, a gate electrode 108 is formed over the gate insulating film 106. The gate electrode 108 is formed in such a manner that a conductive film is formed, a mask is formed over the conductive film, and the conductive film is selectively etched with the use of the mask. Further, the gate electrode 108 overlaps with part of the source electrode 102a and does not overlap with the drain electrode 102b.

The gate electrode 108 can be formed using a metal element selected from aluminum, chromium, copper, tantalum, titanium, molybdenum, and tungsten, an alloy containing any of these metal elements as a component, an alloy containing any of these metal elements in combination, or the like. Further, one or more metal elements selected from manganese or zirconium may be used. In addition, the gate electrode 108 can have a single-layer structure or a stacked-layer structure having two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film, a three-layer structure in which a titanium film, an aluminum film, and a titanium film are stacked in this order, and the like can be used. Alternatively, a film, an alloy film, or a nitride film which contains aluminum and one or more elements selected from titanium, tantalum, tungsten, molybdenum, chromium, neodymium, and scandium may be used.

The gate electrode 108 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

As a material layer in contact with the gate insulating film 106, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a film of a metal nitride (such as InN or ZnN) is preferably provided between the gate electrode 108 and the gate insulating film 106. These films each have a work function of 5 eV or higher, preferably 5.5 eV or higher; thus, the threshold voltage of the electric characteristics of the transistor can be positive. Accordingly, a so-called normally-off switching element can be obtained. For example, in the case of using an In—Ga—Zn—O film containing nitrogen, an In—Ga—Zn—O film having a nitrogen concentration higher than at least the oxide semiconductor film 104, specifically, an In—Ga—Zn—O film having a nitrogen concentration of 7 atomic % or higher is used.

Figure 2C:
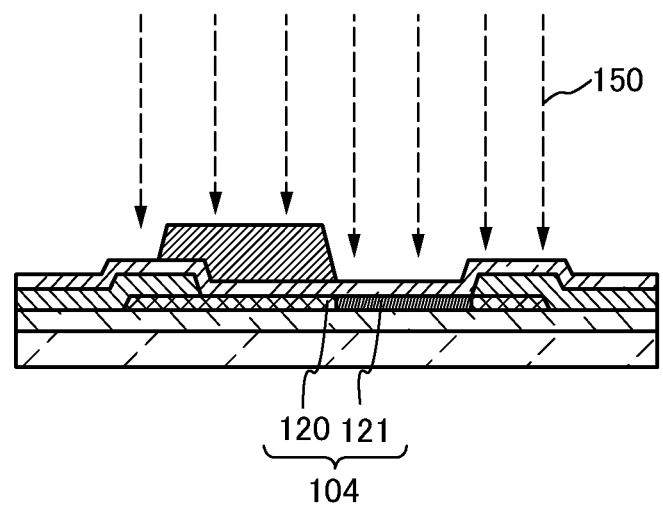

Next, as illustrated in FIG. 2C, ions 150 are added to the oxide semiconductor film 104.

As a method for adding the ions 150 to the oxide semiconductor film 104, an ion doping method or an ion implantation method can be used. Further, at least one of nitrogen, phosphorus, arsenic, and rare gases is added as the ions 150. The ions 150 are added as illustrated in FIG. 2C, so that because the gate electrode 108, the source electrode 102a, and the drain electrode 102b function as masks, the second region 121 to which the ions 150 are added and the first region 120 to which the ions 150 are not added are formed in a self-aligned manner.

In the second region 121 to which the ions 150 are added, crystallinity is decreased owing to damage caused by addition of the ions; thus, the second region 121 are amorphous regions in some cases. By adjusting the conditions for adding the ions such as the amount of the ions to be added, damage to the oxide semiconductor can be reduced, so that the second region 121 which is not completely an amorphous region can be obtained.

In this embodiment, the ions 150 are added to the oxide semiconductor film 104 while the gate insulating film 106 is formed to cover the oxide semiconductor film 104; however, the ions 150 may be added while the oxide semiconductor film 104 is exposed. In this embodiment, the source electrode 102a and the drain electrode 102b function as masks and the ions 150 do not pass through (or are not added) to a lower layer of the source electrode 102a and the drain electrode 102b; however, the ions 150 may pass through the source electrode 102a and the drain electrode 102b by reducing the thicknesses thereof. In that case, the second region 121 is formed in part of the oxide semiconductor film 104 provided in a lower layer of the source electrode 102a and the drain electrode 102b which do not overlap with the gate electrode 108.

Other than an ion doping method, an ion implantation method, or the like, the ions 150 can be added to the oxide semiconductor film by a method in which ions are not implanted. For example, the ions can be added in the following manner: plasma is generated in an atmosphere of a gas containing an element to be added and plasma treatment is performed on an object to which the ions are added. As an apparatus for generating plasma, a dry etching apparatus, a plasma CVD apparatus, a high-density plasma CVD apparatus, or the like can be used.

In addition, heat treatment may be performed after the ions 150 are added.

Figure 2D:
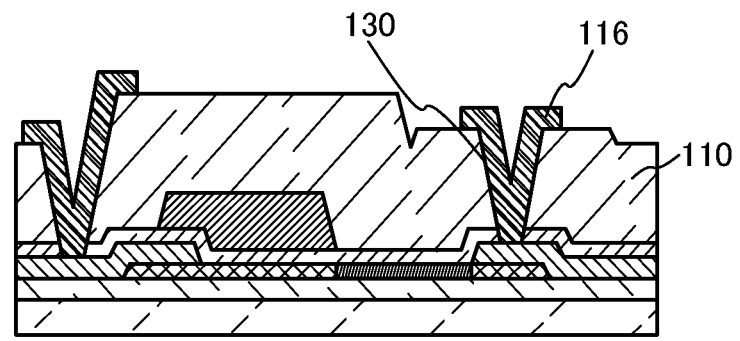

Next, as illustrated in FIG. 2D, the interlayer insulating film 110 is formed over the gate insulating film 106 and the gate electrode 108 and then the wiring 116 connected to the source electrode 102a or the drain electrode 102b in a contact hole 130 provided in the interlayer insulating film 110 is formed.

The interlayer insulating film 110 may be formed with a single layer or a stack using one or more of silicon oxide, silicon oxynitride, silicon nitride oxide, silicon nitride, aluminum oxide, and aluminum nitride by a sputtering method, a CVD method, or the like.

The wiring 116 may be formed using a material similar to that for the gate electrode 108.

When a semiconductor device manufactured in the above process is used for a transistor to which high drain voltage is applied, such as a switch of an electric power circuit, concentration of an electric field on an end of a drain electrode can be reduced; therefore, dielectric breakdown can be suppressed. Further, a drastic reduction in on-state current can be suppressed while concentration of an electric field can be reduced.

Next, results of a simulation by a calculation which was performed on the semiconductor device illustrated in FIGS. 1A and 1B are described below. Further, for comparison, a similar simulation was performed on the semiconductor device illustrated in FIG. 6, and the results are described.

The calculations were performed under conditions shown in Table 1. Note that the simulations show electric-field intensity in the case where gate voltage and source voltage are 0 V and drain voltage is 100 V.

TABLE 1

| | |
|---|---|
| Donor density [cm$^{-3}$] (channel region) | $1 \times 10^{13}$ |
| Donor density [cm$^{-3}$] (ion doped region) | $1 \times 10^{17}$ |
| Relative permittivity of insulating layer | 4.0 |
| Relative permittivity of semiconductor layer | 15.0 |
| Carrier mobility of semiconductor layer [cm$^2$/V·s] | 10.0 |
| Electron affinity of semiconductor layer [eV] | 4.3 |
| Band gap width of semiconductor layer [eV] | 3.15 |
| Effective density of states of conduction band [cm$^{-3}$] | $5 \times 10^{18}$ |
| Effective density of states of valence band [cm$^{-3}$] | $5 \times 10^{18}$ |
| Work function of gate electrode [eV] | 4.6 |
| Work functions of source electrode and drain electrode [eV] | 4.3 |

Further, the effective density of states is obtained at a temperature of 300 K and the values are obtained on the assumption that tungsten is used for the gate electrode and a stack of titanium, aluminum, and titanium in this order is used for the source electrode and the drain electrode.

Figure 6:
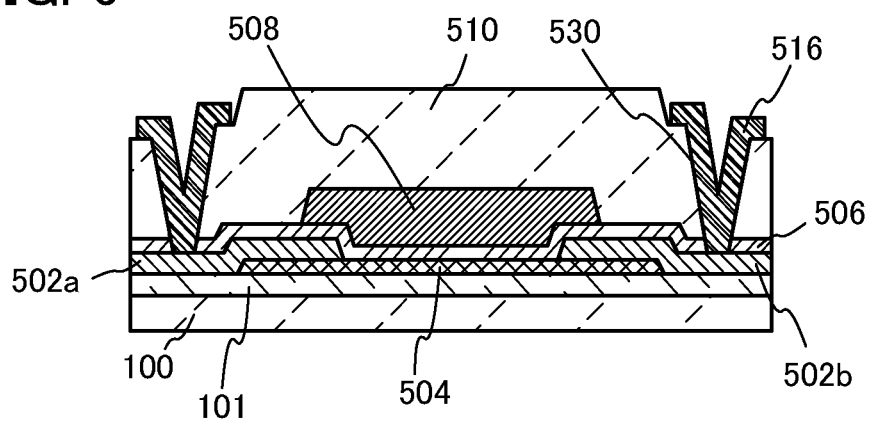
FIG. 6 is a cross-sectional view illustrating a comparative example of a semiconductor device according to one embodiment of the present invention.
Figure 7:
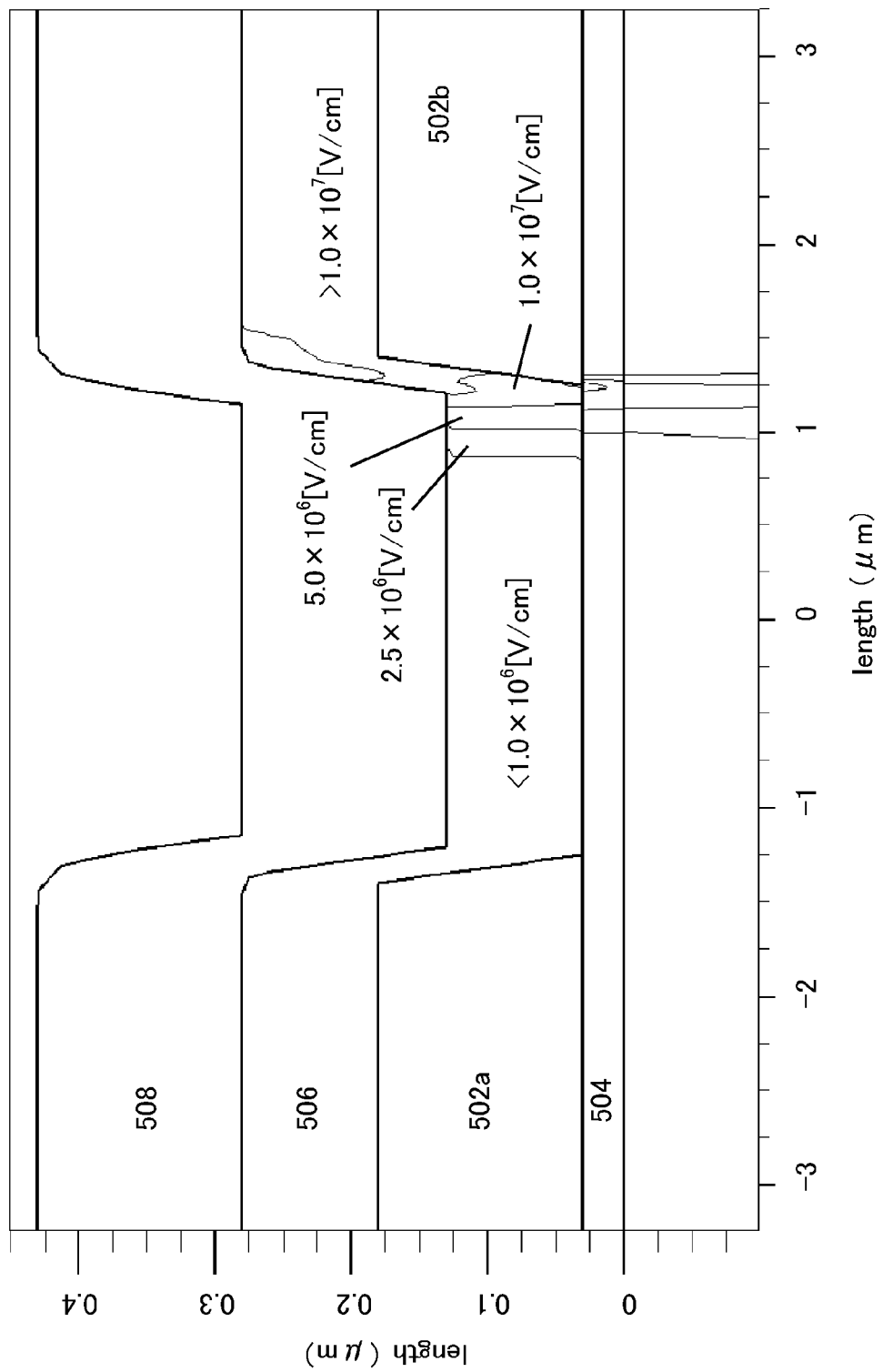
FIG. 7 shows calculation results of an electric-field distribution.

FIG. 7 shows calculation results of an electric-field distribution of a transistor of the same embodiment as FIG. 6. A relation between an electric-field distribution and a length (μm) as a center portion between the source electrode 502a and the drain electrode 502b is set to be zero is shown. FIG. 6 shows a structure in which part of the gate electrode 508 and part of the drain electrode 502b overlap with each other. FIG. 7 shows that the maximum electric-field intensity is marked at a portion where the gate insulating film 506 overlaps with both of the gate electrode 508 and the drain electrode 502b, and the electric-field intensity is approximately $1.0 \times 10^7$ [V/cm].

Figure 8:
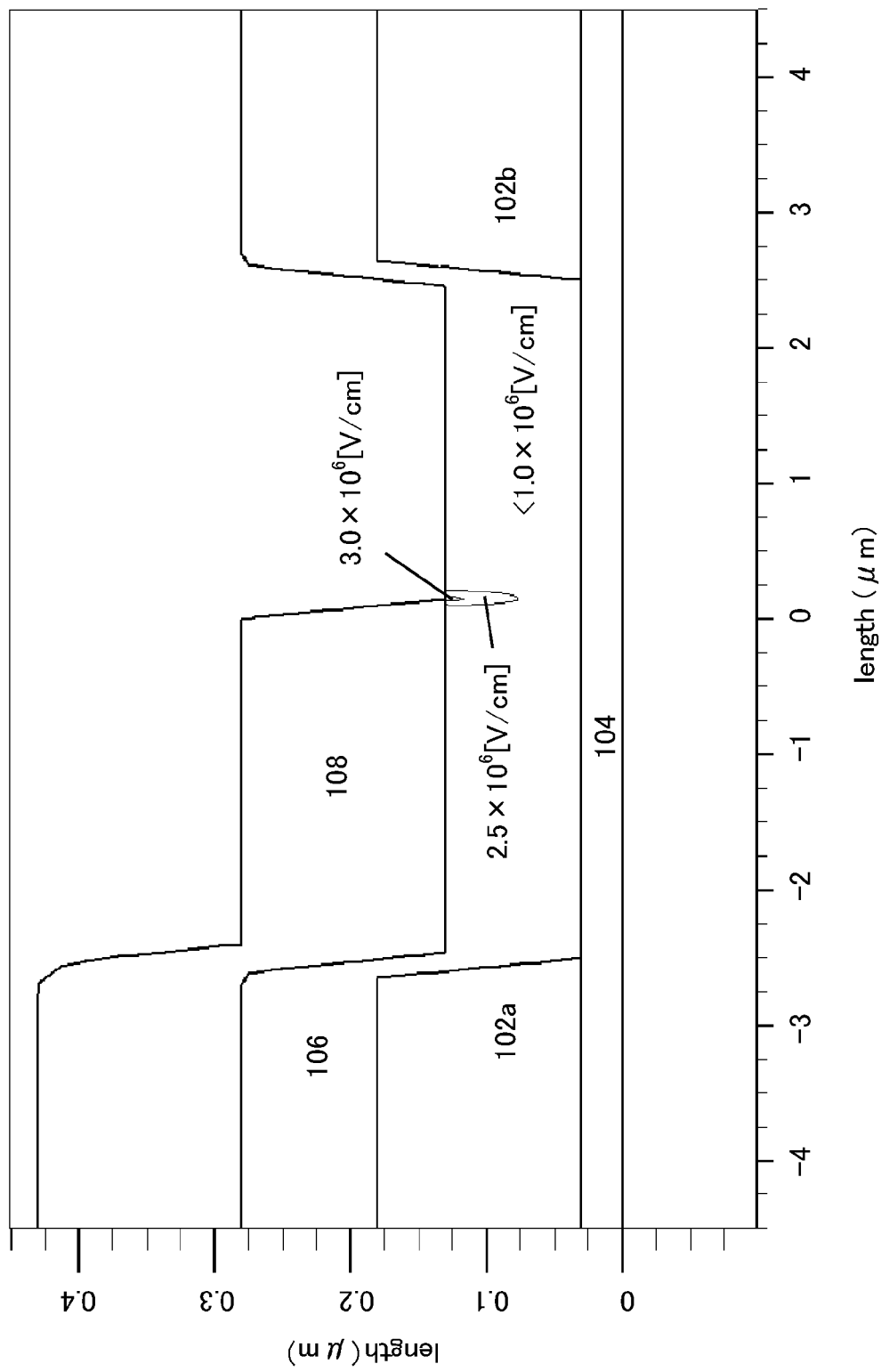
FIG. 8 shows calculation results of an electric-field distribution.

On the other hand, FIG. 8 shows calculation results of an electric-field distribution of a transistor of the same embodiment as FIGS. 1A and 1B. A relation between an electric-field distribution and a length (μm) as a center portion between the source electrode 102a and the drain electrode 102b is set to be zero is shown. FIGS. 1A and 1B show a structure where the gate electrode 108 and the drain electrode 102b do not overlap with each other. FIG. 8 shows that the maximum electric-field intensity is marked directly below a drain-electrode-side end portion of the gate electrode 108 and the electric-field intensity is approximately $3.0 \times 10^6$ [V/cm].

As seen from comparison between the results shown in FIG. 7 and FIG. 8, concentration of an electric field on an end portion of a drain electrode can be effectively reduced with the structure shown in FIGS. 1A and 1B where the gate electrode and the drain electrode do not overlap with each other and the off-set region is provided. Further, in FIG. 8, an electric field is concentrated on a portion where a gate insulating film is flat. In contrast, in FIG. 7, an electric field is concentrated on a portion where the gate insulating film overlaps with both of the gate electrode and the drain electrode, which indicates that withstand voltage of the gate insulating film is reduced in comparison with the case shown in FIG. 8.

Figure 9:
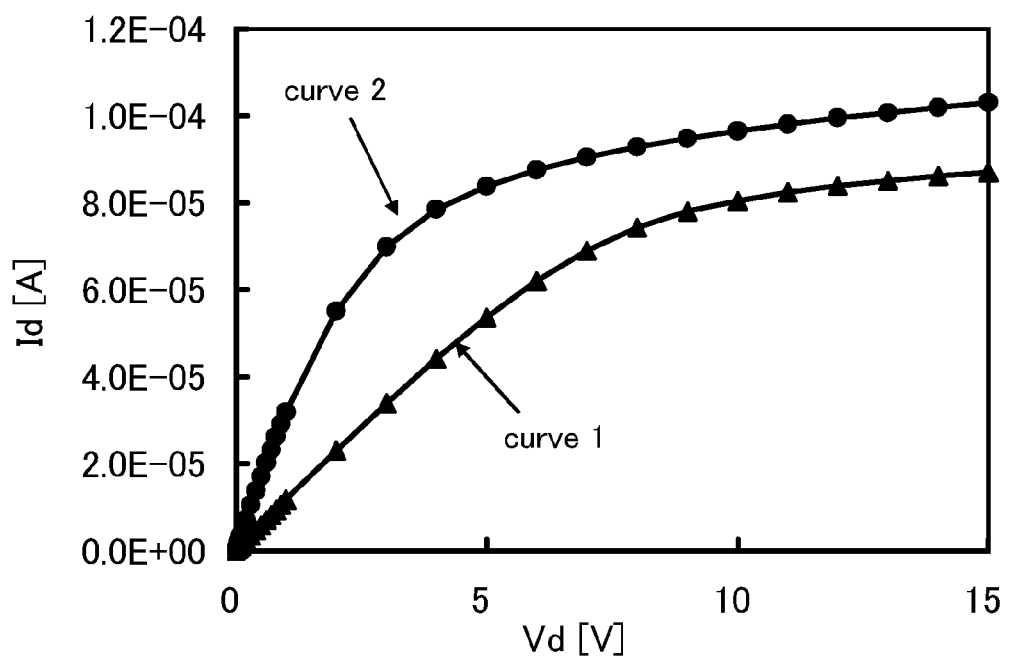
FIG. 9 shows calculation results of drain current-drain voltage characteristics.

Next, FIG. 9 shows results of comparison between the drain current (Id)—drain voltage (Vd) characteristics of semiconductor devices having the same structures illustrated in FIG. 6 and FIGS. 1A and 1B. Calculations are performed under conditions shown in Table 2.

TABLE 2

| | |
|---|---|
| Donor density [cm$^{-3}$] (ion doped region) | $1 \times 10^{17}$ |
| Relative permittivity of insulating layer | 4.0 |
| Relative permittivity of semiconductor layer | 15.0 |
| Carrier mobility of semiconductor layer [cm$^2$/V·s] | 7.0 |
| Electron affinity of semiconductor layer [eV] | 4.3 |
| Band gap width of semiconductor layer [eV] | 3.15 |
| Effective density of states of conduction band [cm$^{-3}$] | $5 \times 10^{18}$ |
| Effective density of states of valence band [cm$^{-3}$] | $5 \times 10^{18}$ |
| Work function of gate electrode [eV] | 4.6 |
| Work functions of source electrode and drain electrode [eV] | 4.3 |
| Length of L [μm] | 2.5 |
| Length of W [μm] | 100 |

FIG. 9 shows that when an Id-Vd curve (curve 1) of a structure where a gate electrode and a drain electrode do not overlap with each other and an off-set region is provided as illustrated in FIGS. 1A and 1B is compared with an Id-Vd curve (curve 2) of a structure where a gate electrode and a drain electrode overlap with each other as illustrated in FIG. 6, there is a great difference between the current values of the curve 1 and the curve 2 in a linear region but there is no great difference between the current values in a saturation region. A semiconductor device according to one embodiment of the present invention can be effectively used for a power device. Because a power device is used in a region where a gate voltage is lower than a voltage between a source electrode and a drain electrode (i.e., a saturation region), loss of on-state current of the semiconductor device is very small even in the case of having a structure where an off-set region is provided between a gate electrode and the drain electrode as illustrated in FIGS. 1A and 1B.

As described above, in the semiconductor device illustrated in FIGS. 1A and 1B, concentration of an electric field on an end of a drain electrode is sufficiently reduced and a drastic reduction in on-state current due to the concentration of an electric field does not occur.

Embodiment 2

A semiconductor device which is one embodiment of the present invention is not limited to the structure described in Embodiment 1. In this embodiment, a semiconductor device which is one embodiment of the present invention and is different from that of Embodiment 1 will be described.

Figure 3:
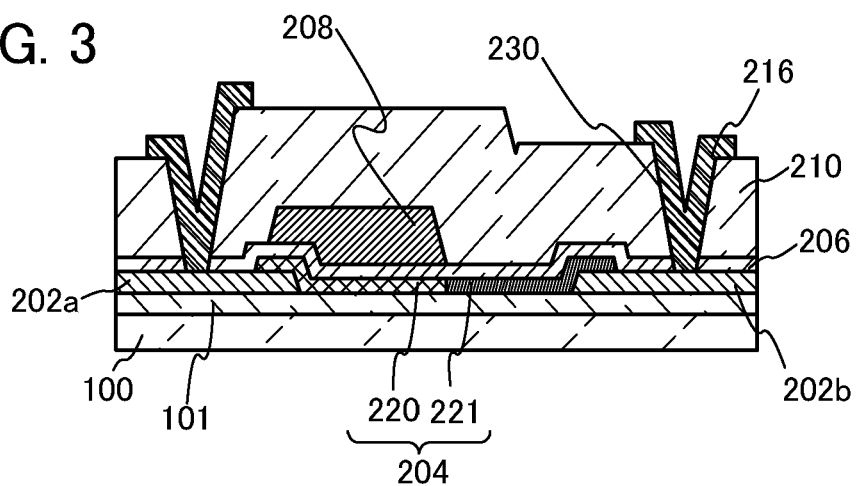
FIG. 3 is a cross-sectional view illustrating an example of a semiconductor device according to one embodiment of the present invention.

FIG. 3 is a cross-sectional view of the semiconductor device of this embodiment.

The semiconductor device illustrated in FIG. 3 includes the base insulating film 101 provided over the substrate 100; a source electrode 202a and a drain electrode 202b which are provided over the base insulating film 101 so as to be separated from each other; an oxide semiconductor film 204 which is provided over the source electrode 202a and the drain electrode 202b, is partly in contact with the source electrode 202a and the drain electrode 202b, and includes a first region 220 and a second region 221; a gate insulating film 206 which is provided over the oxide semiconductor film 204, the source electrode 202a, and the drain electrode 202b; a gate electrode 208 which is provided over the gate insulating film 206, overlaps with part of the source electrode 202a and the first region 220 with the gate insulating film 206 provided therebetween, and does not overlap with the drain electrode 202b; an interlayer insulating film 210 which is provided over the gate insulating film 206 and the gate electrode 208; and a wiring 216 which is connected to the source electrode 202a and the drain electrode 202b in a contact hole 230 provided for the interlayer insulating film 210.

Note that at least part of the first region 220 and part of the second region 221 are formed between the source electrode 202a and the drain electrode 202b.

With the above structure, when a semiconductor device which is one embodiment of the present invention is applied to a switch of an electric power circuit or the like, concentration of an electric field on an end of a drain electrode can be reduced and thus withstand voltage can be increased. Thus, the range of voltage which can be used is extended and therefore the semiconductor device can be used for various switches. Further, in the semiconductor device which is one embodiment of the present invention, concentration of an electric field can be reduced as described above and a drastic reduction in on-state current can be suppressed.

Embodiment 3

A semiconductor device which is one embodiment of the present invention is not limited to the structures described in Embodiment 1 and Embodiment 2. In this embodiment, a semiconductor device which is one embodiment of the present invention and is different from those of Embodiment 1 and Embodiment 2 will be described.

Figure 4:
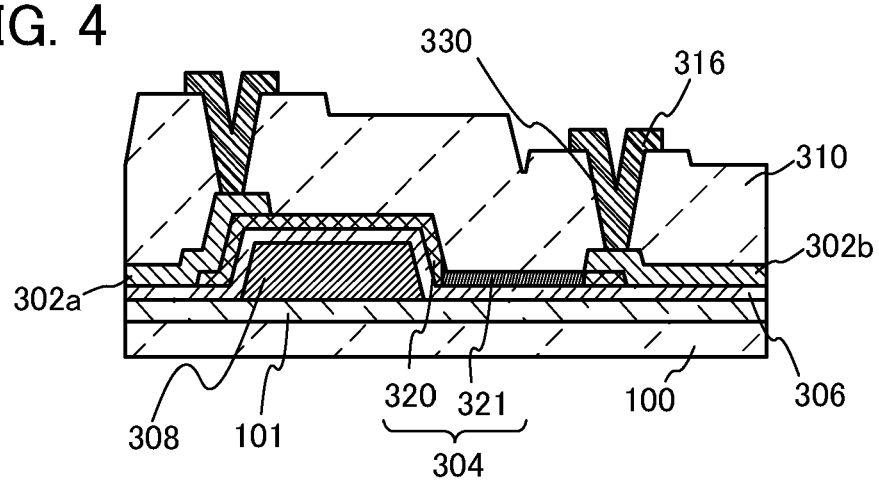
FIG. 4 is a cross-sectional view illustrating an example of a semiconductor device according to one embodiment of the present invention.

FIG. 4 is a cross-sectional view of a semiconductor device of this embodiment.

The semiconductor device illustrated in FIG. 4 includes the base insulating film 101 which is provided over the substrate 100; a gate electrode 308 which is provided over the base insulating film 101; a gate insulating film 306 which is formed over the gate electrode 308; an oxide semiconductor film 304 which is provided over the gate insulating film 306 and includes a first region 320 and a second region 321; a source electrode 302a and a drain electrode 302b which are provided over the oxide semiconductor film 304 to be separated from each other and are partly in contact with the oxide semiconductor film 304; an interlayer insulating film 310 which is provided over the oxide semiconductor film 304, the source electrode 302a, and the drain electrode 302b; and a wiring 316 which is connected to the source electrode 302a and the drain electrode 302b in a contact hole 330 provided for the interlayer insulating film 310. Note that the gate electrode 308 overlaps with part of the source electrode 302a and the first region 320 with the gate insulating film 306 provided therebetween and does not overlap with the drain electrode 302b.

At least part of the first region 320 and part of the second region 321 are formed between the source electrode 302a and the drain electrode 302b.

With the above structure, when a semiconductor device which is one embodiment of the present invention is applied to a switch of an electric power circuit or the like, concentration of an electric field on an end of a drain electrode can be reduced and thus withstand voltage can be increased. Thus, the range of voltage which can be used is extended and therefore the semiconductor device can be used for various switches. Further, in the semiconductor device which is one embodiment of the present invention, concentration of an electric field can be reduced as described above and a drastic reduction in on-state current can be suppressed.

Embodiment 4

A semiconductor device which is one embodiment of the present invention is not limited to the structures described in Embodiment 1 to Embodiment 3. In this embodiment, a semiconductor device which is one embodiment of the present invention and is different from those of Embodiment 1 to Embodiment 3 will be described.

Figure 5:
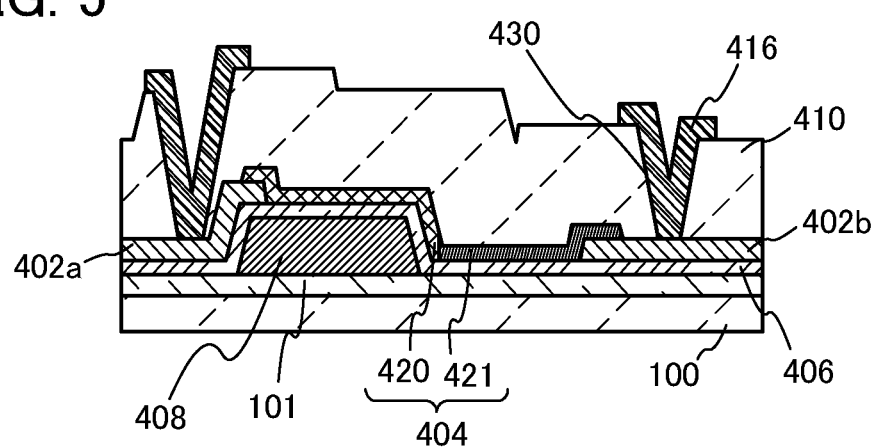
FIG. 5 is a cross-sectional view illustrating an example of a semiconductor device according to one embodiment of the present invention.

FIG. 5 is a cross-sectional view of a semiconductor device of this embodiment.

The semiconductor device illustrated in FIG. 5 includes the base insulating film 101 which is provided over the substrate 100; a gate electrode 408 which is provided over the base insulating film 101; a gate insulating film 406 which is provided over the gate electrode 408; a source electrode 402a and a drain electrode 402b which is provided over the gate insulating film 406 so as to be separated from each other; an oxide semiconductor film 404 which is provided over the source electrode 402a and the drain electrode 402b, is in contact with the source electrode 402a and the drain electrode 402b, and includes a first region 420 and a second region 421; an interlayer insulating film 410 which is provided over the oxide semiconductor film 404, the source electrode 402a, and the drain electrode 402b; and a wiring 416 which is connected to the source electrode 402a and the drain electrode 402b in a contact hole 430 provided for the interlayer insulating film 410. Note that the gate electrode 408 overlaps with part of the source electrode 402a and the first region 420 with the gate insulating film 406 provided therebetween and does not overlap with the drain electrode 402b.

At least part of the first region 420 and part of the second region 421 are formed between the source electrode 402a and the drain electrode 402b.

With the above structure, when a semiconductor device which is one embodiment of the present invention is applied to a switch of an electric power circuit or the like, concentration of an electric field on an end of a drain electrode can be reduced and thus withstand voltage can be increased. Thus, the range of voltage which can be used is extended and therefore the semiconductor device can be used for various switches. Further, in the semiconductor device which is one embodiment of the present invention, concentration of an electric field can be reduced as described above and a drastic reduction in on-state current can be suppressed.

This application is based on Japanese Patent Application serial no. 2011-037352 filed with Japan Patent Office on Feb. 23, 2011, the entire contents of which are hereby incorporated by reference.

What is claimed is:

1. A semiconductor device comprising:
    an oxide semiconductor film including a first region and a second region;
    a first electrode in contact with the oxide semiconductor film;
    a second electrode in contact with the oxide semiconductor film;
    a gate insulating film adjacent to the oxide semiconductor film; and
    a gate electrode adjacent to the oxide semiconductor film with the gate insulating film therebetween,
    wherein the gate electrode is closer to the first electrode than to the second electrode,
    wherein the first region is overlapped with the gate electrode, and
    wherein the second region is between the gate electrode and the second electrode.

2. The semiconductor device according to claim 1, wherein the second region is not overlapped with the gate electrode.

3. The semiconductor device according to claim 1, wherein the oxide semiconductor film includes a third region in contact with the second electrode, and wherein the second region is between the first region and the third region.

4. The semiconductor device according to claim 3, wherein an electric resistance of the second region is lower than an electric resistance of the third region.

5. The semiconductor device according to claim 1, wherein the gate electrode overlaps with part of the first electrode.

6. The semiconductor device according to claim 1, wherein an electric resistance of the second region is lower than an electric resistance of the first region.

7. The semiconductor device according to claim 1, wherein the first electrode is a source electrode and the second electrode is a drain electrode.

8. The semiconductor device according to claim 1, wherein the oxide semiconductor film contains two or more kinds of elements selected from In, Ga, Sn, and Zn.

9. The semiconductor device according to claim 1, wherein the second region contains one or more of elements selected from nitrogen, phosphorus, arsenic, and a rare gas at $1\times10^{17}$ atoms/cm$^3$ or higher and $1\times10^{22}$ atoms/cm$^3$ or lower.

10. The semiconductor device according to claim 1, wherein the oxide semiconductor film includes a crystal region in an amorphous phase.

11. The semiconductor device according to claim 1, wherein c-axes of the crystal region are aligned in a direction perpendicular to a top surface of the oxide semiconductor film.

12. A semiconductor device comprising:
    an oxide semiconductor film including a first region and a second region;
    a first electrode in contact with the oxide semiconductor film;
    a second electrode in contact with the oxide semiconductor film;
    a gate insulating film adjacent to the oxide semiconductor film; and
    a gate electrode adjacent to the oxide semiconductor film with the gate insulating film therebetween,
    wherein the gate insulating film is on and in contact with the oxide semiconductor film,
    wherein the gate electrode is on and in contact with the gate insulating film,
    wherein the gate electrode is closer to the first electrode than to the second electrode,
    wherein the first region is overlapped with the gate electrode, and
    wherein the second region is between the gate electrode and the second electrode.

13. The semiconductor device according to claim 12, wherein the second region is not overlapped with the gate electrode.

14. The semiconductor device according to claim 12, wherein the oxide semiconductor film includes a third region in contact with the second electrode, and wherein the second region is between the first region and the third region.

15. The semiconductor device according to claim 14, wherein an electric resistance of the second region is lower than an electric resistance of the third region.

16. The semiconductor device according to claim 12, wherein the gate electrode overlaps with part of the first electrode.

17. The semiconductor device according to claim 12, wherein an electric resistance of the second region is lower than an electric resistance of the first region.

18. The semiconductor device according to claim 12, wherein the first electrode is a source electrode and the second electrode is a drain electrode.

19. The semiconductor device according to claim 12, wherein the oxide semiconductor film contains two or more kinds of elements selected from In, Ga, Sn, and Zn.

20. The semiconductor device according to claim 12, wherein the second region contains one or more of elements selected from nitrogen, phosphorus, arsenic, and a rare gas at $1\times10^{17}$ atoms/cm$^3$ or higher and $1\times10^{22}$ atoms/cm$^3$ or lower.

21. The semiconductor device according to claim 12, wherein the oxide semiconductor film includes a crystal region in an amorphous phase.

22. The semiconductor device according to claim 12, wherein c-axes of the crystal region are aligned in a direction perpendicular to a top surface of the oxide semiconductor film.

23. A semiconductor device comprising:
   an oxide semiconductor film including a first region and a second region;
   a first electrode in contact with the oxide semiconductor film;
   a second electrode in contact with the oxide semiconductor film;
   a gate insulating film adjacent to the oxide semiconductor film; and
   a gate electrode adjacent to the oxide semiconductor film with the gate insulating film therebetween,
   wherein the gate insulating film is on and in contact with the gate electrode,
   wherein the oxide semiconductor film is on and in contact with the gate insulating film,
   wherein the gate electrode is closer to the first electrode than to the second electrode,
   wherein the first region is overlapped with the gate electrode, and
   wherein the second region is between the gate electrode and the second electrode.

24. The semiconductor device according to claim 23, wherein the second region is not overlapped with the gate electrode.

25. The semiconductor device according to claim 23, wherein the oxide semiconductor film includes a third region in contact with the second electrode, and wherein the second region is between the first region and the third region.

26. The semiconductor device according to claim 25, wherein an electric resistance of the second region is lower than an electric resistance of the third region.

27. The semiconductor device according to claim 23, wherein the gate electrode overlaps with part of the first electrode.

28. The semiconductor device according to claim 23, wherein an electric resistance of the second region is lower than an electric resistance of the first region.

29. The semiconductor device according to claim 23, wherein the first electrode is a source electrode and the second electrode is a drain electrode.

30. The semiconductor device according to claim 23, wherein the oxide semiconductor film contains two or more kinds of elements selected from In, Ga, Sn, and Zn.

31. The semiconductor device according to claim 23, wherein the second region contains one or more of elements selected from nitrogen, phosphorus, arsenic, and a rare gas at $1\times10^{17}$ atoms/cm$^3$ or higher and $1\times10^{22}$ atoms/cm$^3$ or lower.

32. The semiconductor device according to claim 23, wherein the oxide semiconductor film includes a crystal region in an amorphous phase.

33. The semiconductor device according to claim 23, wherein c-axes of the crystal region are aligned in a direction perpendicular to a top surface of the oxide semiconductor film.

* * * * *